United States Patent
Kim

(10) Patent No.: US 7,203,810 B2
(45) Date of Patent: Apr. 10, 2007

(54) SYNCHRONOUS SEMICONDUCTOR MEMORY DEVICE HAVING MULTI-BANK SCHEME

(75) Inventor: Chul-soo Kim, Suwon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 502 days.

(21) Appl. No.: 10/298,553

(22) Filed: Nov. 19, 2002

(65) Prior Publication Data

US 2003/0101323 A1    May 29, 2003

(30) Foreign Application Priority Data

Nov. 26, 2001  (KR) ............................... 2001-73737

(51) Int. Cl.
*G06F 12/00* (2006.01)
(52) U.S. Cl. ........................ 711/168; 711/167
(58) Field of Classification Search ............... 711/5, 711/167, 168, 169; 365/230.04, 230.03
See application file for complete search history.

(56) References Cited

U.S. PATENT DOCUMENTS

| | | | |
|---|---|---|---|
| 4,734,850 A * | 3/1988 | Torii et al. ................... | 711/169 |
| 4,881,206 A * | 11/1989 | Kadono ....................... | 365/227 |
| 5,367,494 A * | 11/1994 | Shebanow et al. ..... | 365/230.03 |
| 5,570,320 A | 10/1996 | Runas | |
| 5,615,355 A * | 3/1997 | Wagner ....................... | 711/167 |
| 5,959,911 A * | 9/1999 | Krause et al. ............... | 365/201 |
| 6,301,649 B1 | 10/2001 | Takasugi | |
| 6,330,627 B1 * | 12/2001 | Toda ........................... | 710/104 |
| 6,351,427 B1 * | 2/2002 | Brown ................... | 365/230.03 |
| 6,745,271 B2 * | 6/2004 | Toda ........................... | 710/104 |

* cited by examiner

*Primary Examiner*—Matthew Kim
*Assistant Examiner*—Michael Krofcheck
(74) *Attorney, Agent, or Firm*—Harness, Dickey & Pierce, P.L.C.

(57) ABSTRACT

A synchronous semiconductor memory device allows one memory bank to begin executing a data operation (e.g., reading data from a memory cell) while another memory bank is executing another data operation (e.g., writing data to a memory cell). The synchronous semiconductor memory device includes a write data path through which an input data signal is transmitted to the memory cell of a memory bank executing a write operation, and a read data path through which an output data signal is transmitted from the memory cell of a memory bank executing a read operation to an input/output pin. The read and write data paths are each connected to the memory banks via a common input/output line. The operation of the memory banks and the write and read data paths are synchronized, such that once a first memory bank begins executing either the write or read operation, a second memory bank may begin executing the other type of data operation after a predetermined time delay has elapsed, while the first memory bank is still executing its data operation.

5 Claims, 4 Drawing Sheets

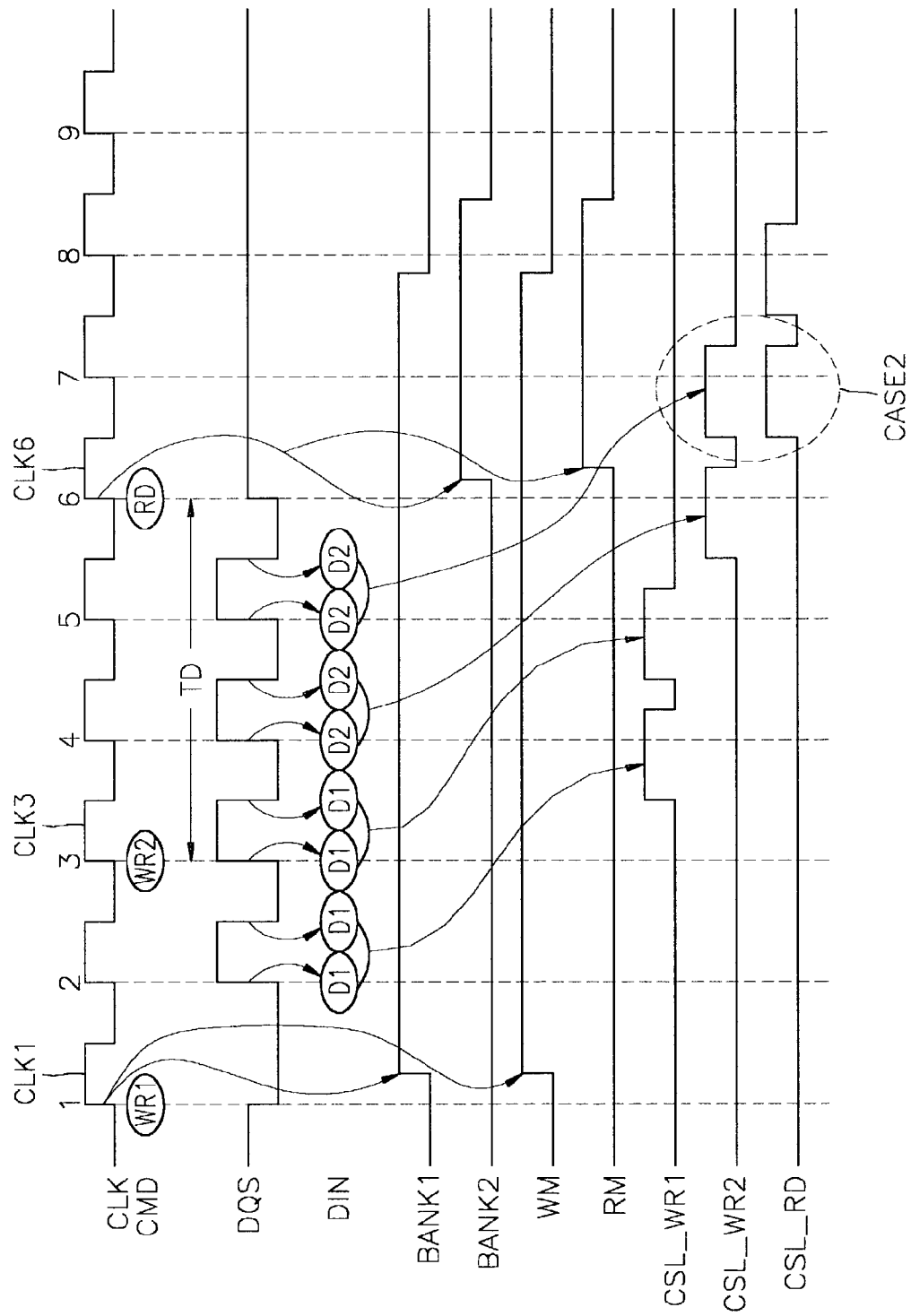

SYNCHRONOUS SEMICONDUCTOR MEMORY DEVICE HAVING MULTI-BANK SCHEME

RELATED APPLICATION

This application claims the benefit under 35 U.S.C. § 119(a) of Korean Patent Application No. 2001-0073737, filed on Nov. 26, 2001, the contents of which are hereby incorporated by reference in their entirety.

BACKGROUND OF THE INVENTION

1. Field of the Invention

The present invention relates to a synchronous semiconductor memory device having a multi-bank arrangement, and more particularly, to a synchronous semiconductor memory device having multiple memory banks that perform at least part of their respective data operations at the same time.

2. Description of the Related Art

To realize high-speed and highly integrated memory devices, a multi-memory bank that is composed of a plurality of memory banks is generally used. Each of the plurality of memory banks comprises a plurality of blocks arranged as a plurality of cell arrays in the column and row directions.

Conventional synchronous semiconductor memory devices having a multi-bank arrangement include a plurality of memory banks that are made up of a plurality of memory cells. Here, each memory bank is activated at a predetermined interval to execute a write operation and a read operation sequentially on a memory bank within the respective memory bank. For instance, after a first memory bank completes the write operation, a second memory bank starts executing the read operation.

FIG. 1 is a timing diagram of the write and read operations of a conventional synchronous semiconductor memory device having multi-bank scheme. Referring to FIG. 1, a write command WR is generated in synchronization with a first clock signal CLK1, and then applied to the synchronous semiconductor memory device. Also, a read command RD is generated in synchronization with a sixth clock signal CLK6, and then is applied to the synchronous semiconductor memory device.

Further, an input data signal DIN, the burst length of which includes four data packets, is fetched by a data strobe signal DQS. Then, the fetched input data is written to a memory cell included in a first memory bank of the synchronous semiconductor memory device in response to a write column selection signal WR_CSL.

After a fifth period of the clock signal CLK has passed, a read command RD is generated in synchronization with a sixth clock signal CLK6, and then, an output data signal (not shown) is read from a memory cell included in a second memory bank of the synchronous semiconductor memory device in response to a read column selection signal RD_CSL. That is, the read operation of the second memory bank starts after the write operation of the first memory bank.

In a conventional synchronous semiconductor memory device having multi-bank scheme, no read command RD is given until five cycles of the clock signal CLK passes after a write command WR is applied to the synchronous semiconductor memory device. That is, a predetermined time delay occurs after the write operation is performed before the read operation begins. During such a time delay, the data bus line of the synchronous semiconductor memory device is in an idle state, and thus, an input/output data signal is not transferred at this time. For this reason, the performance of the synchronous semiconductor memory device may be inefficient.

A suggested solution to this problem is to generate the read command RD in synchronization with a third clock signal CLK3, rather than the sixth clock signal CLK6. However, in this case, a write column selection signal WR_CSL and a read column selection signal RD_CSL are activated at the same time, which would cause malfunction of the synchronous semiconductor memory device.

FIG. 2 is a timing diagram of a conventional synchronous semiconductor memory device having multi-bank scheme in which an error occurs. Referring to FIG. 2, a second write command WR2 is applied to a first memory bank in response to a third clock signal CLK, during which a second write column selection signal WR2-CSL and a read column selection signal RD_CSL are activated at the same time, thus causing the malfunction of the synchronous semiconductor memory device as indicated by CASE1.

SUMMARY OF THE INVENTION

The present invention is directed to a synchronous semiconductor memory device including multiple memory banks, in which one of memory bank is capable of writing data while another memory bank reads data. The synchronous semiconductor memory device includes a write data path and a read data path, which share a common data bus line (input/output line) used for accessing the multiple memory banks.

The operation of the memory banks and the write and read data paths are synchronized by signals, which are generated by a synchronization device in the synchronous semiconductor memory device. These signals include data path activation signals for activating the write and read data path, respectively. The synchronization device also generates a write bank selection signal and a read bank selection signal. The write bank selection signal selects the memory bank for performing the write data operation in conjunction with the activated write data path, while the read bank selection signal selects the memory bank for performing the read data operation in conjunction with the activated read data path.

In one embodiment of the present invention, a first memory bank starts performing either the write or read data operation in response to the synchronization signals. Then, the synchronization signals cause a second memory bank to begin executing the other type of data operation after a predetermined time delay elapses after the first memory bank started performing its data operation. For example, after one memory bank begins writing data, a predetermined time delay (e.g., three clock cycles) elapses, and another memory bank begins reading data from memory cells, even though the former memory bank is still writing data.

Accordingly, the present invention helps reduce the amount of time that a data bus line (input/output line) is idle when two memory banks need to perform a write and read operation, respectively, thereby allowing the synchronous semiconductor memory device to perform more efficiently.

BRIEF DESCRIPTION OF THE DRAWINGS

The above objective and advantages of the present invention will become more apparent by describing in detail exemplary embodiments thereof with reference to the attached drawings in which:

FIG. 4 is a timing diagram of the operation of the synchronous semiconductor memory device of FIG. 3.

DETAILED DESCRIPTION OF THE INVENTION

Figure 1:
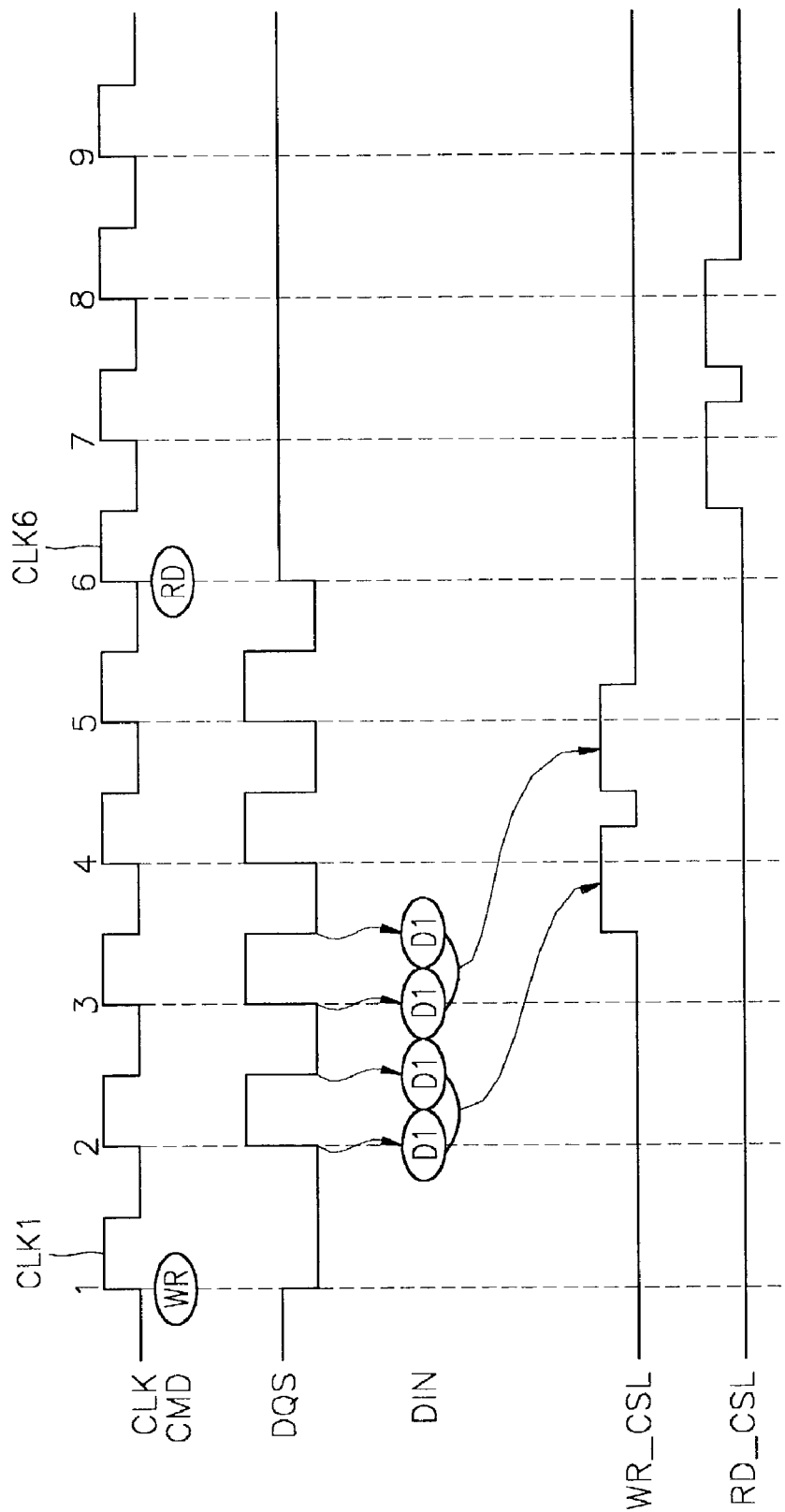
FIG. 1 is a timing diagram of write and read operations of a conventional synchronous semiconductor memory device having a multi-bank arrangement.
Figure 2:
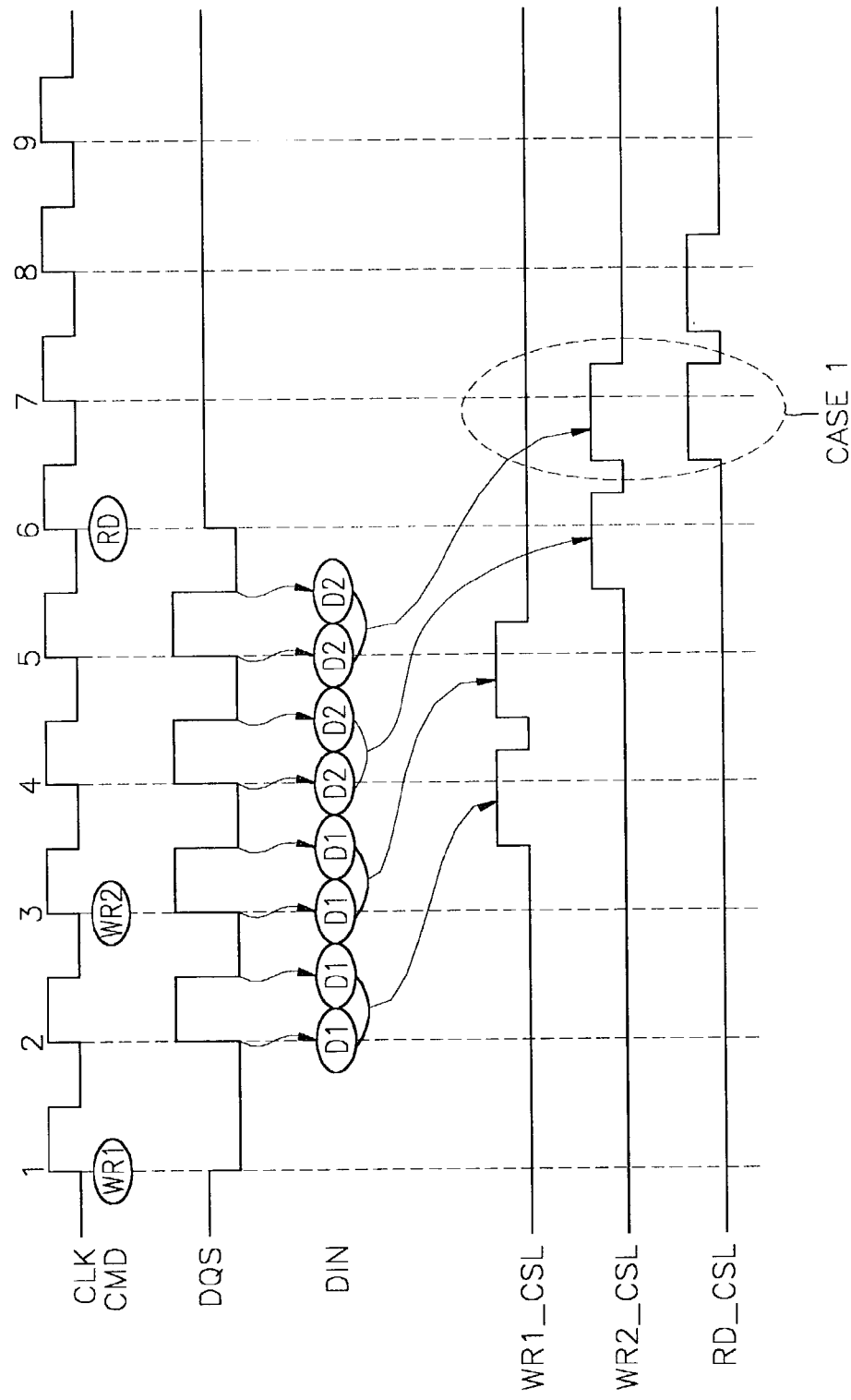
FIG. 2 is a timing diagram of a conventional synchronous semiconductor memory device having a multi-bank arrangement illustrating the occurrence of an error.
Figure 3:
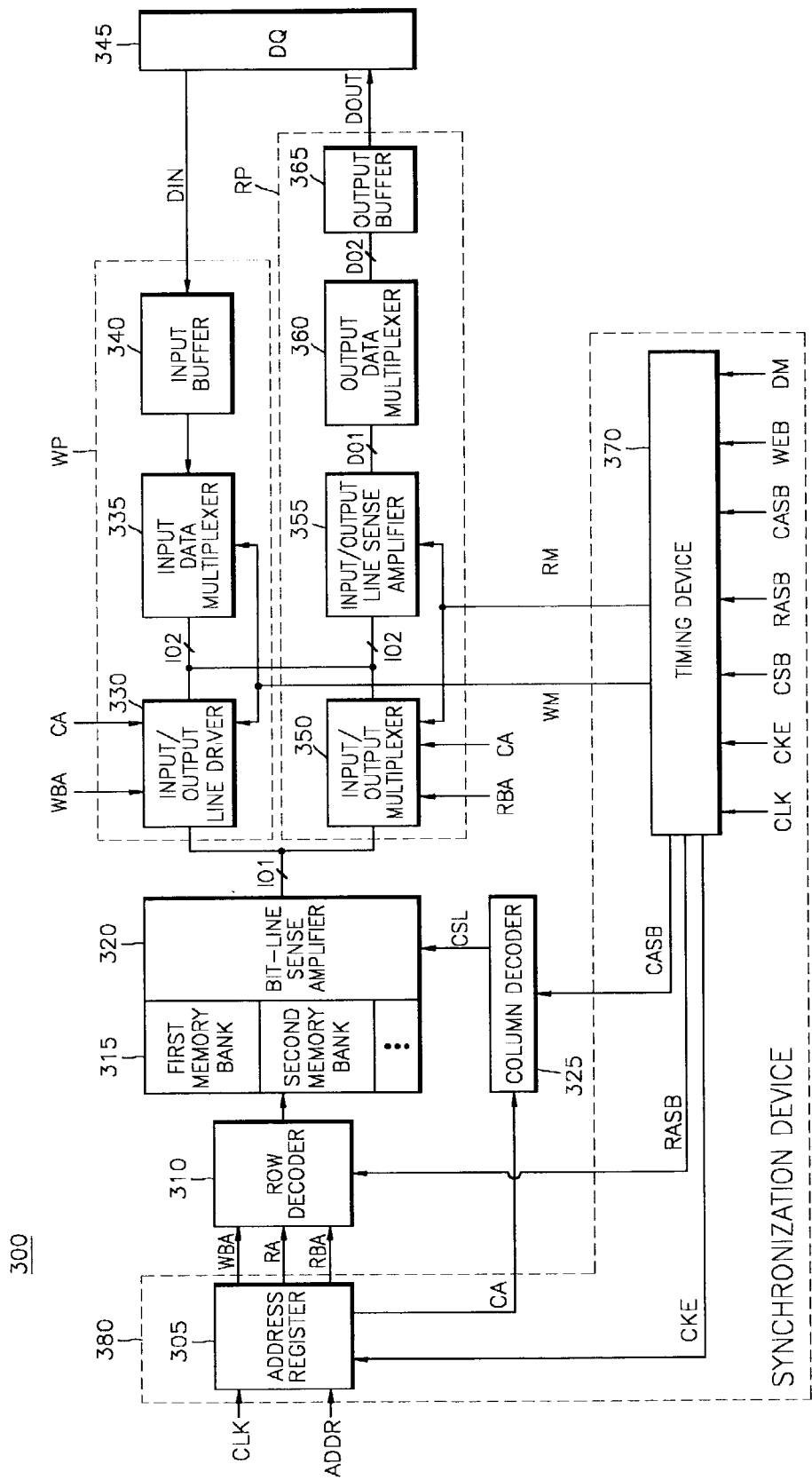
FIG. 3 is a block diagram of a synchronous semiconductor memory device having a multi-bank arrangement according to an exemplary embodiment of the present invention.

FIG. 3 is a block diagram of a synchronous semiconductor memory device 300 having a multi-bank arrangement according to a preferred embodiment of the present invention. Referring to FIG. 3, the synchronous semiconductor memory device 300 includes an address register 305, a row decoder 310, a plurality of memory banks 315, a bit-line sense amplifier 320, a column decoder 325, an input/output line driver 330, an input data multiplexer 335, an input buffer 340, an input/output pin DQ 345, an input/output multiplexer 350, an input/output line sense amplifier 355, an output data multiplexer 360, an output buffer 365, and a timing device 370. A plurality of memory banks 315 share a write data path WP and a read data path RP via the bit-line sense amplifier 320. Hereinafter, the operations of the synchronous semiconductor memory device 300 will now be described on the assumption that a first memory bank executes the write operation and a second memory bank executes the read operation.

The write data path WP includes the input/output line driver 330, the input data multiplexer 335, and the input buffer 340. The read data path RP includes the input/output multiplexer 350, the input/output line sense amplifier 355, the output data multiplexer 360, and the output buffer 365. The write data path WP and the read data path RP share the first and second input/output lines IO1 and IO2.

The timing device 370 generates data path activation signals based on control signals, which are related to the operation of the synchronous semiconductor memory device 300. The timing device also controls the timing of certain control signals to synchronize the read and write operations, thus generating a write master signal WM, a read master signal RM, a row address strobe signal RASB, a column address strobe signal CASB, and a clock enable signal CKE.

The above operational signals related to the operation of the synchronous semiconductor memory device 300 may be a clock signal CLK, a clock enable signal CKE, a chip selection signal CSB, the row address strobe signal RASB, the column address strobe signal CASB, a write enable signal WEB and an input data mask signal DM. Here, the clock enable signal CKE is a control signal that activates the clock signal CLK. The chip selection signal CSB is a signal that activates or deactivates the operation of the synchronous semiconductor memory device 300. The write enable signal WEB is a control signal that activates the write operation of the synchronous semiconductor memory device 300. The input data mask signal DM is a signal that blocks the input data signal DIN. The row address strobe signal RASB is a signal informing the application of a row address signal RA. The column address strobe signal CASB is a signal informing of the application of the column address signal CA. The timing device 370 controls the timing at which the control signals CKE, RASB, and CASB are sent to other components of the of the synchronous memory device 300.

The write master signal WM is a data path activation signal that activates the write data path WP, and controls the input/output line driver 330 and the input data multiplexer 335. Also, the read master signal RM is a data path activation signal that activates the read data path RP, and controls the input/output multiplexer 350 and the input/output line sense amplifier 335. By generating the write master signal WM and the read master signal RM to activate the write data path WP and read data path RP, respectively, the timing device 370 can be referred to as a data path activation device.

Each of the plurality of memory banks 315 includes a plurality memory cells, and the memory cells store data therein.

The address register 305 generates a write bank selection signal WBA, a read bank selection signal RBA, a row address signal RA and a column address signal CA in response to an address signal ADDR in synchronization with the clock signal CLK. The write bank selection signal WBA is a signal for selecting the first memory bank that executes the write operation, and the read bank selection signal RBA is a signal selecting the second memory bank that executes the read operation. Also, the row address signal RA and the column address signal CA are signals that select the memory cells of the first memory bank and the second memory bank, respectively. The clock enable signal CKE is applied to activate the clock signal CLK for the address register 305.

The timing device (data path activation device) 370 and the address register 305 each generate signals for synchronizing the operation of the write data path WP, read data path RP, and the first and second memory banks, such that a read data operation is performed by the second memory bank while at least part of a write data operation is being performed by the first. Therefore, the timing device 370 and the address register 305 collectively form a synchronization device 380 of the synchronous semiconductor memory device 300. Furthermore, the data path activation signals WM and RM generated by the timing device 370, along with the write bank selection signal WBA, read bank selection signal RBA, row address signal RA and column address signal CA generated by the address register 305 comprise a set of synchronization signals generated by the synchronization device 380.

The row decoder 310 decodes the write bank selection signal WBA, the read bank selection signal RBA and the row address signal RA, and then selects a word line of the first memory bank for writing, and a word line of the second memory bank for reading. These selected word lines respectively correspond to the location of a memory cell in the first memory bank to data is written, and the location of a memory cell in the second memory bank from which data is read. The row address strobe signal RASB is applied to the row decoder 310.

The column decoder 325 decodes the column address signal CA, and generates a column selection signal CSL for selecting column selection lines of the first and second memory banks. The selected column selection lines respectively correspond to the location of a memory cell in the first memory bank to which data is written, and the location of a memory cell in the second memory bank from which data is read. The column address strobe signal CASB is applied to the column decoder 325.

The bit-line sense amplifier 320 amplifies a data signal written to, or output from, memory cells included in the memory banks 315, in response to the column selection signal CSL.

During the operation of the components included in the write data path WP, an input data signal DIN is applied to the input buffer 340 via the input/output pin 345. Then, the input buffer 340 buffers the input data signal DIN, and transmits the buffered input signal DIN to the input data multiplexer 335. Next, the input data multiplexer 335 transmits the buffered input data signal DIN to the input/output line IO2 of the write data path WP, in response to the write master signal WM. Thereafter, the input/output line driver 330 responds to the write bank selection signal WBA, the column address signal CA selecting the memory cell of the first memory, and the write master signal WM by transmitting the input data signal DIN to the memory cell of the first memory bank selected by the column address signal CA. The input data signal DIN is transmitted to the selected memory cell via input/output line IO1.

Next, during the operation of the components included in the read data path RP, the input/output multiplexer 350 responds to the read bank selection signal RBA, the column address signal CA selecting the memory cell of the second memory bank, and the read master signal RM by transmitting an output data signal DOUT, which was transmitted from the memory cell of the second memory bank via the input/output line IO1. The input/output multiplexer 350 transmits the output data signal DOUT to the input/output lines IO2.

Then, the input/output line sense amplifier 355 receives and amplifies the output data signal DOUT from the input/output line IO2 of the read data path RP, and transmits the amplified output data signal DOUT to a first data output line DO1, in response to the read master signal RM.

Next, the output data multiplexer 360 receives the output data signal DOUT from the first data output line DO1, and transmits the received output data signal DOUT to a second data output line DO2.

Then, the output buffer 365 receives and buffers the output data signal DOUT from the second data output line DO2, and, then transmits the buffered output data signal DOUT to the input/output pin 345.

As described above, the synchronous semiconductor memory device 300, according to one embodiment of the present invention, is capable of executing the write operation of the first memory bank via one write data path, in response to the write master signal WM, and then executing the read operation of the second memory bank via one read data path in response to the read master signal RM after a predetermined time delay, even though the write operation is still being executed. While both the write and read operations are being performed, data bus lines included in the write data path WP and the read data path RP are not in an idle state, allowing the synchronous semiconductor memory device 300 to efficiently use the data bus lines. Preferably, the value of the delay time is three times as much as the period of the clock signal CLK at minimum.

FIG. 4 is a timing diagram of the operation of the synchronous semiconductor memory device of FIG. 3. Referring to FIG. 4, BANK1 denotes a first bank activation signal that indicates that the fist memory bank is activated, and BANK2 denotes a second bank activation signal that indicates that the second memory bank is activated.

When a first write command WR1, which is in synchronization with a first clock signal CLK1, is applied to the synchronous semiconductor memory device 300 of FIG. 3, the first bank activation signal BANK1 and the write master signal WM are activated to reach logic 'high'. Then, a first input data signal D1 is fetched by a data strobe signal DQS. Next, the column selection signal CSL is generated to write the first fetched input data signal D1 to the memory cell of the first memory bank. Referring to FIG. 4, CSL_WR1 denotes a first write column selection line activation signal, which indicates that a column selection line of the memory cell for writing the first input data signal D1 is activated.

When a second write command WR2, which is in synchronization with a third clock signal CLK3, is applied to the synchronous semiconductor memory device 300, a second input data signal D2 is fetched by the data strobe signal DQS. Thereafter, the column selection signal CSL is generated to write the second fetched input data signal D2 to the memory cell of the first memory bank. Referring to FIG. 4, CSL_WR2 denotes a second write column selection line activation signal, which indicates that a column selection line of the memory cell for writing the second input data signal D2 is activated.

After a time delay TD has passed, which corresponds to three cycles of the clock signal CLK after the second write command WR2 is issued, a read command RD, which is in synchronization with a sixth clock signal CLK6, is applied to the synchronous semiconductor memory device 300. When the read command RD is applied, the second bank activation signal BANK2 and the read master signal RM are activated to reach logic 'high.' In other words, while the first memory bank operates, the second memory bank also operates. Thereafter, the column selection signal CSL is generated, and then, an output data signal DOUT is read from the memory cell of the second memory bank. In FIG. 4, CSL_RD a read column selection line activation signal indicating that a column selection line of the memory cell for reading the output data signal DOUT is activated.

As indicated by CASE2 of FIG. 4, the column selection line activation signals CSL_WR2 and CSL_RD are activated to logic 'high' at the same time, showing that the second memory bank BANK2 executes the read operation during the write operation of the first memory bank BANK1.

An exemplary mode of operation is described above for the synchronous semiconductor memory device 300 of the present invention, in which a second memory bank starts executing the read operation while a first memory bank is already executing the write operation. However, the above description is merely illustrative, and in no way limits the present invention to such a mode of operation. For example, the second memory bank may begin executing a write operation while the first memory bank is executing a read operation. Accordingly, a data bus line shared by the first and second memory banks can be efficiently used, thereby enhancing the performance of the synchronous semiconductor memory device.

While the present invention has been particularly shown and described with reference to an exemplary embodiment thereof, the present invention is not restricted to the above embodiment. Further, it will be understood by those skilled in the art that various changes in form and details may be made without departing from the spirit and scope of the invention as defined by the appended claims.

What is claimed is:

1. A synchronous semiconductor memory device comprising:
   a first memory bank including a first memory cell, the first memory bank being configured to execute a first data operation on the first memory cell;

a second memory bank including a second memory cell, the second memory bank being configured to execute a second data operation on the second memory cell while the first data operation is being executed;

a synchronization device for generating synchronization signals in response to a clock signal and one or more control signals, the synchronization signals synchronizing the execution of the first data operation with respect to the execution of the second data operation;

a first data path for transmitting data between the first memory cell and an input/output device during the first data operation; and a second data path for transmitting data between the second memory cell and the input/output device during the second data operation, wherein each of the first and second memory banks have access to a common input/output line, and wherein the input/output line connects each of the first and second data paths to both the first and second memory banks;

and wherein the synchronization signals include, a first data path activation signal for activating the first data path during the first data operation and a second data path activation signal for activating the second data path during the second data operation, and wherein the synchronization device includes a data path activation device for generating the first and second data path activation signals based on the clock signal and the control signals, and wherein the synchronization signals include first selection signals, the first selection signals including, a first memory bank selection signal for selecting the first memory bank from a plurality of memory banks and first row and column identifiers for identifying a row and column address in the first memory bank corresponding to the first memory cell, and wherein the synchronization signals include second selection signals, the second selection signals including, a second memory bank selection signal for selecting the second memory bank from a plurality of memory banks; and second row and column identifiers for identifying a row and column address in the second memory bank corresponding to the second memory cell, and wherein the first selection signals activate the first memory bank to execute the first data operation on the first memory cell, and the second selection signals activate the second memory bank to execute the second data operation on the second memory cell, and wherein the synchronization device includes an address register for generating the first selection signals in synchronization with the second selection signals based on the clock signal and the control signals.

2. A synchronous semiconductor memory device comprising:

a first memory bank including a first memory cell, the first memory bank being configured to execute a first data operation on the first memory cell;

a second memory bank including a second memory cell, the second memory bank being configured to execute a second data operation on the second memory cell while the first data operation is being executed; and a synchronization device for generating synchronization signals in response to a clock signal and one or more control signals, the synchronization signals synchronizing the execution of the first data operation with respect to the execution of the second data operation, wherein each of the first and second memory banks have access to a common input/output line, and wherein the first data operation is a write data operation and the second data operation is a read data operation and the semiconductor memory device further includes a write data path configured to transmit an input data signal from an input/output device to the first memory bank, the first memory bank executing the write data operation by writing the input data signal to the first memory cell and a read data path configured to transmit an output data signal from the second memory cell to the input/output device, the second memory bank executing the read data operation by reading the output data sianal from the second memory cell, and wherein the input/output line connects each of the read data path and the write data path to both the first memory bank and the second memory bank, and wherein the write data path includes, an input buffer for buffering the input data signal;

an input data multiplexer for transmitting the buffered input data signal from the input buffer in response to the synchronization signals; and an input/output line driver for selecting the first memory cell and transmitting the input data signal from the input data multiplexer to the selected first memory cell via the independent input/output line in response to the synchronization signals.

3. A synchronous semiconductor memory device comprising:

a first memory bank including a first memory cell, the first memory bank being configured to execute a first data operation on the first memory cell;

a second memory bank including a second memory cell, the second memory bank being configured to execute a second data operation on the second memory cell while the first data operation is being executed; and a synchronization device for generating synchronization signals in response to a clock signal and one or more control signals, the synchronization signals synchronizing the execution of the first data operation with respect to the execution of the second data operation, wherein each of the first and second memory banks have access to a common input/output line, and wherein the first data operation is a write data operation and the second data operation is a read data operation and the semiconductor memory device further includes a write data path configured to transmit an input data signal from an input/output device to the first memory bank, the first memory bank executing the write data operation by writing the input data signal to the first memory cell and a read data path configured to transmit an output data signal from the second memory cell to the input/output device, the second memory bank executing the read data operation by reading the output data signal from the second memory cell, and wherein the input/output line connects each of the read data path and the write data path to both the first memory bank and the second memory bank, and wherein the read data path includes, an input/output multiplexer for selecting the second memory cell and receiving the output data signal from the second memory cell via the independent input/output line, the input/output multiplexer transmitting the output data signal in response to the synchronization signals;

an input/output line sense amplifier for amplifying the output data signal from the input/output multiplexer and transmitting the amplified output data signal in response to the synchronization signals;

an output data multiplexer for transmitting the output data signal from the input/output line sense amplifier; and an output buffer for buffering the output data signal from the output data multiplexer.

4. A synchronous semiconductor memory device comprising:

a first memory bank including a first memory cell, the first memory bank being configured to execute a first data operation on the first memory cell;

a second memory bank including a second memory cell, the second memory bank being configured to execute a second data operation on the second memory cell while the first data operation is being executed; and a synchronization device for generating synchronization signals in response to a clock signal and one or more control signals, the synchronization signals synchronizing the execution of the first data operation with respect to the execution of the second data operation, wherein each of the first and second memory banks have access to a common input/output line, and wherein the first data operation is a write data operation and the second data operation is a read data operation and the semiconductor memory device further includes a write data path configured to transmit an input data signal from an input/output device to the first memory bank, the first memory bank executing the write data operation by writing the input data signal to the first memory cell and a read data path configured to transmit an output data signal from the second memory cell to the input/output device, the second memory bank executing the read data operation by reading the output data signal from the second memory cell, and wherein the input/output line connects each of the read data path and the write data path to both the first memory bank and the second memory bank, and wherein the synchronization signals include read data path activation signal for activating the read data path for the read data operation and a write data path activation signal for activating the write data path for the second data operation, and wherein he synchronization device includes a data path activation device for generating the read and write data path activation signals based on the clock signal and the control signals, and wherein the synchronization signals include write selection signals, the write selection signals including, a write memory bank selection signal for selecting the first memory bank from a plurality of memory banks and write row and column identifiers for identifying a row and column address in the first memory bank corresponding to the first memory cell, and wherein the synchronization signals include read selection signals, the read selection signals including, a read memory bank selection signal for selecting the second memory bank from a plurality of memory banks and read row and column identifiers for identifying a row and column address in the second memory bank corresponding to the second memory cell, and wherein the write selection signals activate the first memory bank to execute the write data operation on the first memory cell, and the read selection signals activate the second memory bank to execute the read data operation on the second memory cell, and wherein the synchronization device includes an address register for generating the write selection signals in synchronization with the read selection signals based on the clock signal and the control signals.

5. A semiconductor memory device, comprising:

a plurality of memory banks, which include at least a first and second memory bank; and a write and a read data path connected to each of the plurality of memory banks by a combined input/output line;

a synchronization device for generating data path activation signals, the data path activation signals synchronizing the execution of the write data operation of the first memory bank and the read data operation of the second memory bank, the data path activation signals including, a write data path activation signal for activating the write data path and a read data path activation signal for activating the read data path, wherein the first memory bank is configured to execute, while the second memory bank executes a write data operation using the write data path, a read data operation using the read data path, and wherein the synchronization device generates the data path activation signals in order to activate the single write data path for the write data operation a predetermined time delay after activating the single read data path for the read data operation.

* * * * *